United States Patent [19]

Hornbeck et al.

[11] 4,082,965

[45] Apr. 4, 1978

[54] HIGH VOLTAGE PULSER

[75] Inventors: Donald W. Hornbeck, Pelham, N.H.; James P. O'Loughlin, Albuquerque, N. Mex.

[73] Assignee: The United States of America as represented by the Secretary of the Army, Washington, D.C.

[21] Appl. No.: 754,302

[22] Filed: Dec. 27, 1976

[51] Int. Cl.² .......................................... H03K 17/00
[52] U.S. Cl. ................................... 307/260; 307/243; 328/61
[58] Field of Search ..................... 307/260, 262, 241; 328/61, 65, 67

[56] References Cited

U.S. PATENT DOCUMENTS 3,639,784  2/1972  Kelleher, Jr. .................. 307/260
3,764,830  10/1973  Blare et al. .................... 307/260

Primary Examiner—Stanley D. Miller, Jr.
Assistant Examiner—B. P. Davies
Attorney, Agent, or Firm—Nathan Edelberg; Robert P. Gibson; Freddie M. Bush

[57] ABSTRACT

A solid state high voltage pulser is disclosed for providing modulation to radio frequency tubes. The use of solid state switching and a step up high voltage pulse transformer provides direct pulsing of a radio frequency tube alternately from two pulser channels. The solid state high voltage pulser utilizes a low voltage battery prime power source and primarily functions as the cathode power supply modulator for a traveling wave tube.

6 Claims, 4 Drawing Figures

HIGH VOLTAGE PULSER

DEDICATORY CLAUSE

The invention described herein was made under a contract with the Government and may be manufactured, used, and licensed by or for the Government for governmental purposes without the payment to us of any royalties thereon.

BACKGROUND OF THE INVENTION

Prior art methods by which a radio frequency tube such as a traveling wave tube (TWT) may be powered and modulated include high voltage battery prime power operation and low voltage battery prime power operation. High voltage battery operation of a TWT continuous wave (CW) over the entire period of operation can be accomplished with a high voltage battery having a self-contained activation system. The TWT filament power is derived from a suitably designed section integral to the negative end cells of the high voltage unit. A pulse loaded battery the same size as the CW battery can be used, the peak and CW currents being equal. Critical factors effecting the feasibility of the CW approach are the development of a reliable high voltage battery and the development of a TWT which can sustain CW operation at high power. A high voltage battery prime power source with a form of modulation such as cathode modulation requires high voltage switches capable of handling full cathode voltage and feed current. Where the system is to operate under shock and vibration environment, there appears to be no suitable relay that can maintain operation. A high voltage string of silicon control rectifiers or transistors is feasible for maintaining operation, with sufficient compensation to prevent failure, but these have not been completely successful in prior art operation. A line type pulser can be employed using a cathode pulse modulator with a low voltage solid state pulse generation and a separate transformer to obtain high voltage. However, with the line type pulser using the pulse transformer, it is impossible to obtain both rise time and ripple on top of the pulse simultaneously. The current waveform requirement is more difficult to meet with a line type pulser. It is possible to design the discharge characteristics of the pulse forming network to give the leading edge spike and flat portion of the waveform but it is not possible to obtain the negative spike on the trailing edge of the waveform which allows a fast fall time to be obtained.

Voltage pulsers for radio frequency tubes are well established in the prior art. Typically "Introduction to Radar Systems" by M. I. Sknolnik, McGraw-Hill Book Company, 1962, pages 248-254 disclose pulsers. Similarly, the "Radar Handbook" by M. I. Sknolnik, McGraw-Hill Book Company, 1970, pages 7-68 through 7-87 disclose considerable background in radio frequency tube modulator circuits.

SUMMARY OF THE INVENTION

The high voltage pulser uses solid state switching in a step up high voltage transformer to provide direct switching using low voltage battery prime power. Both a high voltage and pulse shaping output to the cathode of a TWT is provided. A high frequency input pulse trigger is directed to a pulse steering circuit. The steering circuit output delivers alternate pulses to respective channels for providing output pulses at one-half the trigger pulse repetition frequency (PRF). Pulse stretchers in respective channels control the amount of time a pulse is supplied to the TWT.

DESCRIPTION OF THE PREFERRED EMBODIMENT

Solid state switching combined with a step up high voltage pulse transformer provides a high voltage pulser for modulating the cathode of a traveling wave tube amplifier. The pulser is capable of providing the required high voltage to the cathode of a traveling wave tube and simultaneously modulating the cathode with a desired wave envelope. Since the pulser is all solid state, turn on after long periods of storage is limited only by the battery activation time and the traveling wave tube warm up time. Pulse rise time, fall time, width and amplitude can be varied within the limitations of the output transformer by merely adjusting trim resistors, providing a wide range of flexibility in the output waveshape with a minimum of inconvenience.

Figure 1:
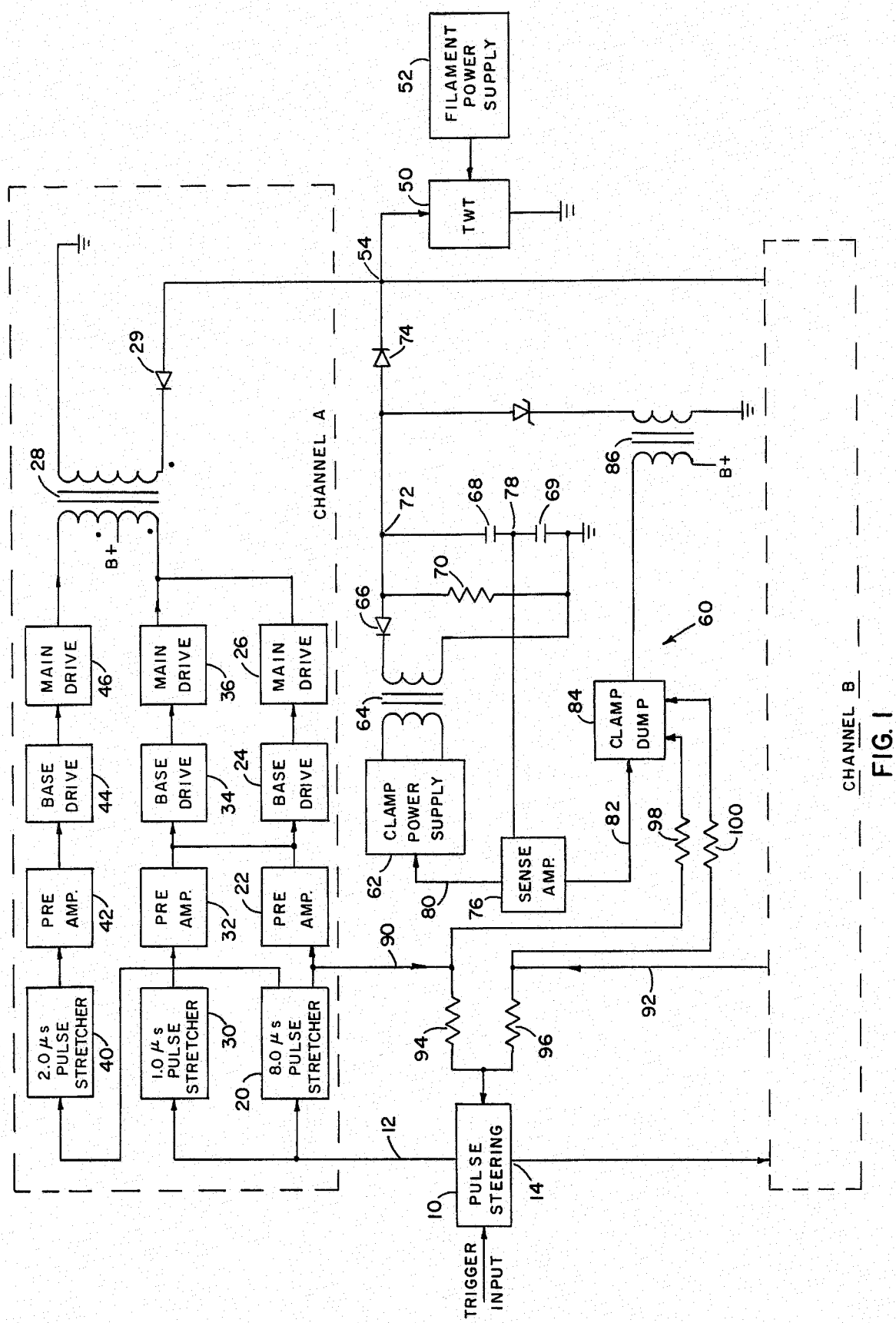
FIG. 1 is a block diagram of a preferred embodiment of the solid state high voltage pulser.

Referring now to the drawings wherein like numbers represent like parts in the several views, FIG. 1 discloses a preferred embodiment of the invention. A high frequency input pulse trigger is directed to a pulse steering circuit 10. The steering circuit output delivers alternate pulses respectively to channel A and channel B. Both channel A and channel B operate in the same manner and are comprised of identical components. Since both circuits are identical all channel circuitry is described with respect to channel A. Output 12 of pulse steering circuit 10 is coupled to provide a pulse to pulse stretchers 20 and 30 of channel A. Output 14 of pulse steering circuit 10 is coupled to provide alternate pulses to channel B. Therefore each channel is effectively operating at one-half the trigger pulse repetition frequency input.

There are three microcircuit pulse stretchers in each channel, providing 8 $\mu s$, 1 $\mu s$ and 2 $\mu s$ duration pulses respectively. Pulse stretcher 20 provides an 8 $\mu s$ output pulse to a preamplifier 22 and provides a separate output pulse as an input to the 2 $\mu s$ pulse stretcher 40. The output of preamplifier 22 is coupled to a base drive circuit 24, with the output of base drive circuit 24 being coupled as the input to a main drive circuit 26. Similarly the output of 1 $\mu s$ pulse stretcher 30 is coupled to the input of a preamplifier 32, the output of preamplifier 32 being coupled to base drive circuit 34 and the output of base drive circuit 34 being coupled as an input to main drive circuit 36. Similarly pulse stretcher 40 has an output coupled to preamplifier 42, which has an output coupled to base drive circuit 44. The output of base drive circuit 44 is coupled as an input to main drive circuit 46 to provide the 2 $\mu s$ circuit. The output of preamplifier 32 is further coupled to the input of base drive circuit 24. This allows the extra drive from the 1 $\mu s$ pulse circuit to provide extra drive for the main drive transistors of the 8 μs pulse circuit to speed up their turn-on time. The signal coupled from the 8 μs pulse stretcher 20 to the 2 μs pulse stretcher input 40 is an impulse or trigger to start the 2 μs pulse. Its time relation to the other 8 μs pulse output of pulse stretcher 20 is determined by the input PRF only. Functionally, each is independent of the other. The output of main drive circuit 26 is coupled in parallel with the output of main drive circuit 36 to one side of the primary winding of pulse transformer 28. The other side of the primary winding is coupled to the output of main drive circuit 46, with B+ being supplied to the system through the center tap of the primary winding. The secondary winding of transformer 28 is coupled on one side to ground and on the other side to the cathode of a diode 29. The anode of diode 29 is coupled to the traveling wave tube 50 for pulsing the tube. Channel B is similarly coupled to receive steering pulses from steering circuit 10, operate in response to these pulses alternately with channel A to couple an output signal in parallel with the output of diode 29 to the traveling wave tube 50. These pulses are coupled to TWT through common junction 54. Filament power for the traveling wave tube is coupled to the tube from filament power supply 52.

A clamping circuit 60 includes a power supply 62 coupled across the primary winding of a transformer 64. The secondary of transformer 64 is coupled through a diode 66, a capacitor bank 68 and 69 and back to the transformer and to a common circuit ground. A resistor bank 70 is coupled in parallel with capacitors 68 and 69 for providing a voltage dividing network. The anode-capacitor junction 72 of the voltage divider network is forward coupled through a diode 74 to the traveling wave tube input junction 54. A sensing amplifier 76 has an input coupled to the junction 78 between capacitor bank 68 and 69 and an output 80 coupled to control clamp power supply 62. Another output 82 of sensing amplifier 76 is coupled to clamp dumping circuit 84 and an output of the clamp dump 84 is coupled through the primary winding of a transformer 86 to B+ (battery). The secondary of transformer 86 is coupled on one side to common ground and on the other side in reverse through a zener diode to junction point 72 between diode 66 and diode 74.

Outputs 90 and 92 respectively from channel A and channel B are coupled through a resistor network 94 and 96 respectively to the pulse steering circuit. Similarly the outputs 90 and 92 are respectively coupled through resistances 98 and 100 to the clamp dump circuit 84.

Figure 2:
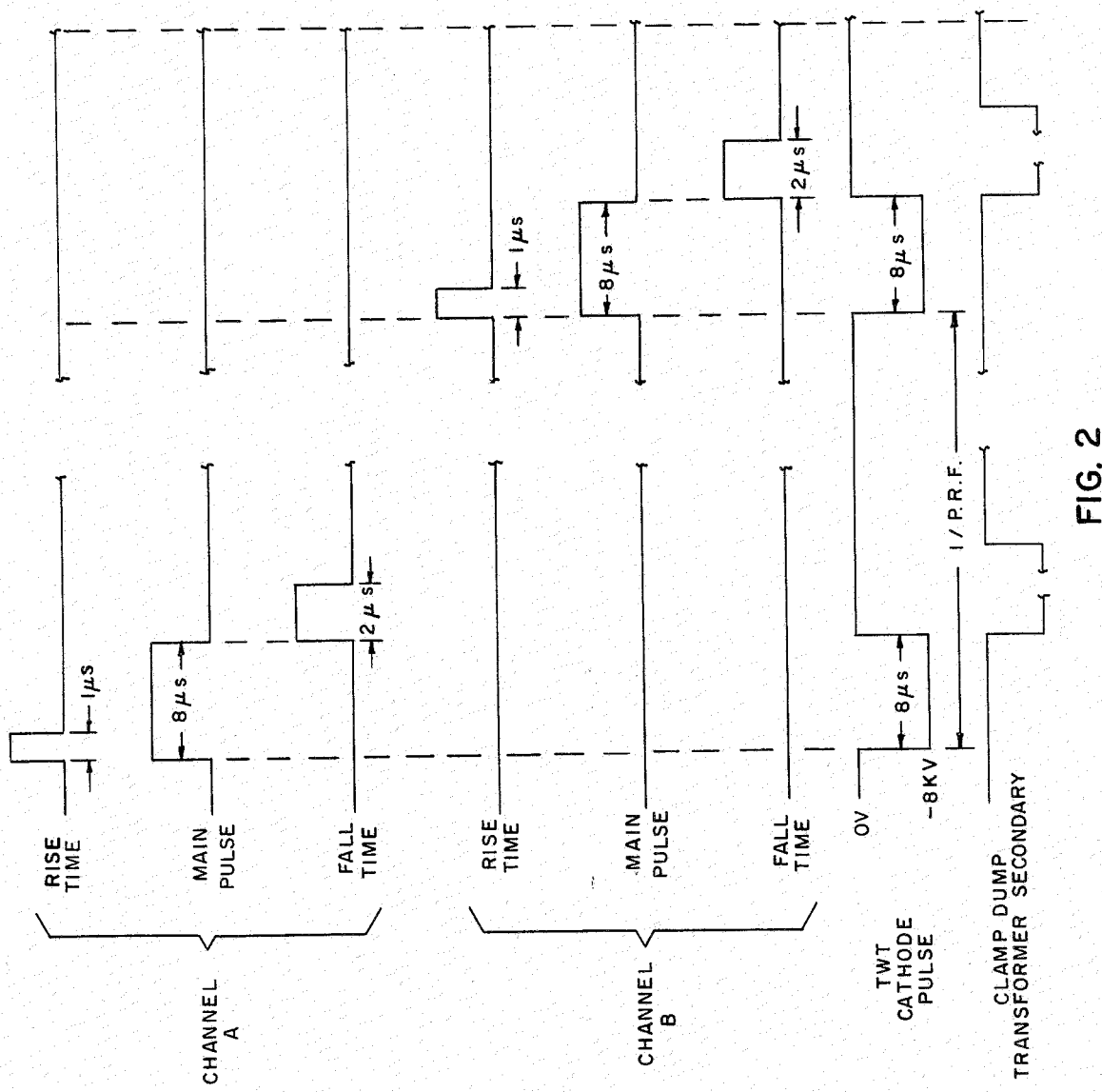
FIG. 2 is a pulse time sequence diagram showing the relationship of the waveshapes in the respective channels to the output pulse.

FIG. 2 disclose the pulse time sequence of the embodiment of FIG. 1. The μs and 8 μs pulses within a given channel start simultaneously. The additional drive provided by the 1 μs output is required to charge the load capacitance 68-69 and the stray capacitance of the transformer's secondary within the allotted time. The 8 μs output provides the load current. At the end of the 8 μs period, the 2 μs drive circuit is triggered. It provides the energy required to discharge the capacitance of the load and the stray capacitance of the transformer secondary within the allotted time. During the 8 μs "on" period perturbations can occur on the output pulse as a result of the dump action of the dumping circuit. This can be eliminated or inhibited during this "on" period by coupling a signal through resistors 98 or 100 to the clamp dump circuit. The traveling wave tube cathode is pulsed during the 8 μs period after which the clamp dump transformer secondary is pulsed.

Figure 3:
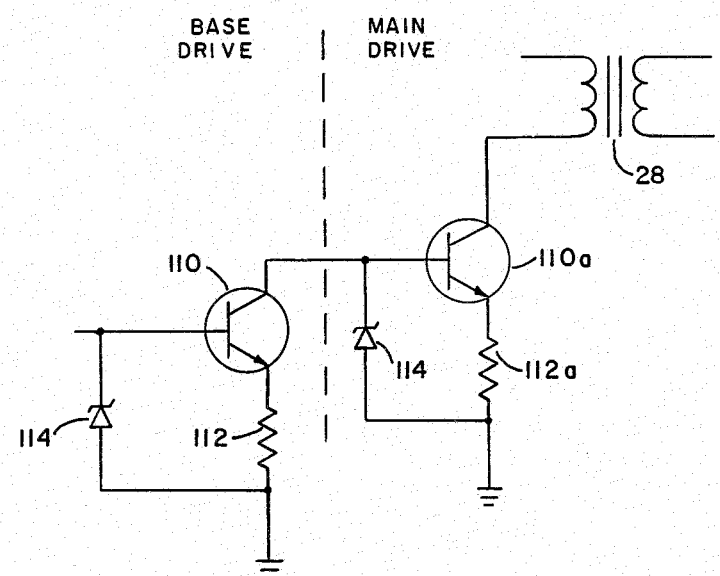
FIG. 3 is a schematic diagram of constant current drivers providing the main drive and base drive and clamp dump circuit operation for the system.

The main drive, base driver, and clamp dump circuits are constant current drivers. FIG. 3 shows a typical circuit that can provide this function. A transistor 110 or parallel group of transistors, has its emitter connected in series with a resistor 112 to a common ground. Using a resistor forward voltage drop of approximately 4 volts, for example, at the desired current, the base or bases of the transistors will then be driven from a 5 volt voltage source. Zener diode 114 is coupled between the base of the transistors to the circuit common for controlling this voltage. The main drive circuit having operational components similar to the base drive circuit is shown coupled to an output transformer 28. The clamp dump circuit is the same type of circuit as the base drive or main drive circuit.

Figure 4:
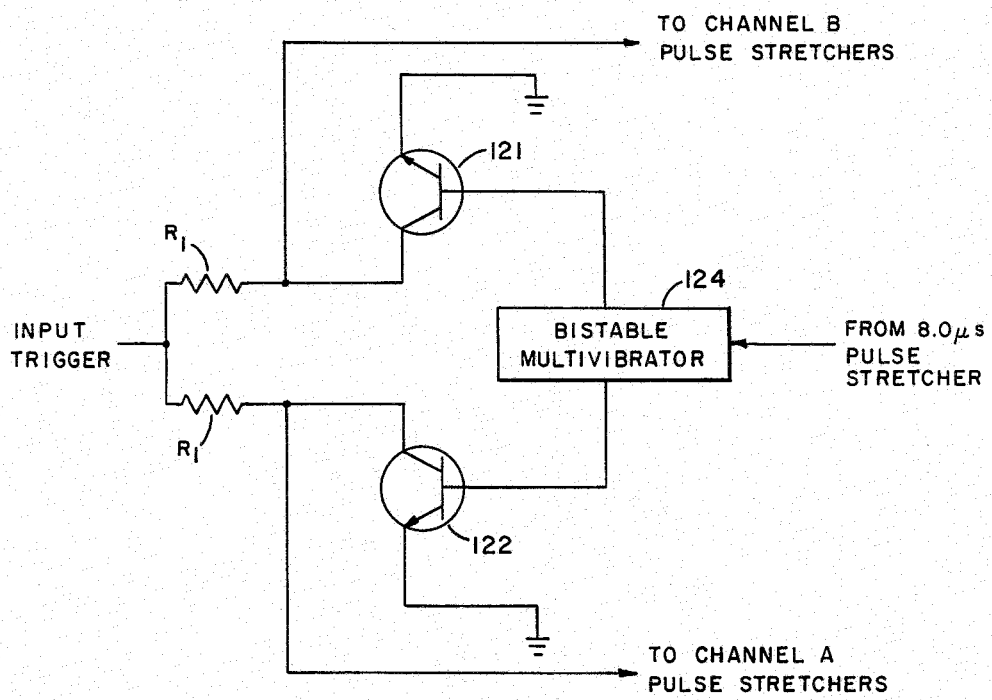
FIG. 4 is a typical pulse steering circuit for alternately switching input pulses to respective channels.

As shown in FIG. 4, the pulse steering circuit comprises a pair of transistors 121 and 122, one transistor for each output channel. Each transistor is driven from opposing outputs of a bistable multivibrator 124. The collectors of the two transistors are resistively coupled through respective resistors R1 to the common input trigger pulse. The emitters of the respective transistors are coupled to ground and the collectors are coupled to provide the respective pulse steering outputs alternately to channel A and channel B. The particular "on" transistor shunts the input signal applied thereto to ground thereby preventing its channel from driving the traveling wave tube. The state of the bistable multivibrator 124 is changed by the output of the "on" channel 8 μs pule stretcher which is coupled through resistors 94 and 96 to the pulse steering circuit as shown in FIG. 1. The sense amplifier is simply a common variety operational amplifier such as the nationl semi-conductor model LM101.

In the clamping circuit 60 the series resistance in parallel with the two series capacitors 68 and 69 form a divider network for the sense amplifier, providing a predetermined approximate voltage at the amplifier input. The capacitors also act as a sync for excessive energy (ripples and spikes) occurring on the output pulse. The capacitors are precharged to the required pulse output voltage by the clamp power supply. When an output pulse occurs the excess voltage is clamped by the diode connected to the load. The clamp dump is inhibited during the on pulse period. Once the inhibit is removed the clamp dump will pulse breaking down the high voltge zener diode connected to the secondary of the clamp dump transformer. The capacitor voltage is restored to the required voltage when the zener diode breaks down.

During operation the high voltage pulser delivers both a high voltage and pulse shaping output to the cathode of the traveling wave tube. A high frequency input pulse trigger, typically a 50 kilohertz pulse, is directed to the pulse steering circuit 10. The steering circuit output delivers alternate pulses to the pulse stretchers of channels A and B. Therefore each channel is effectively operating at one-half the trigger PRF or, for example 25 kilohertz. The respective channel pulse stretcher outputs are amplified, amplitude regulated, and fed to the base of the constant current output transistors which in turn drive the primary of the output pulse transformer. Energy of the 1 μs pulse is used to charge the traveling wave tube capacitance producing a fast pulse rise time, while the 8 μs pulse is the main pulse determining the traveling wave tube on-time. The 2 μs pulse, which occurs at the end of the 8 μs pulse, is used to discharge the traveling wave tube capacitance and to reset the core of the output pulse transformer.

The secondary of the two channel pulse transformers are connected to the load through high voltage diodes applied in an "OR" configuration. In parallel with the load, but isolated from the load by the high voltage diode 74, capacitor bank 68–69 is pre-charged to the required traveling wave tube voltage. When the constant current output of the pulser reaches the required output voltage, all excess drive current is shunted into the capacitor producing a flat topped pulse. During the inner pulse period the excess energy is removed from the capacitors by the clamp dumping circuit so that each pulse will have the same voltage amplitude.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

We claim:

1. A high voltage pulser for cathode driving a traveling wave tube, comprising: first and second channels for driving said traveling wave tube, a pulse steering circuit for receiving high pulse repetition frequency input signals and coupling the outputs at one-half the input repetition frequency to said first and second channels alternately, and a clamp circuit coupled across said traveling wave tube for clamping excess voltage levels coupled to said traveling wave tube from said first and second channels.

2. A high voltage pulser as set forth in claim 1 wherein each of said first and second channels comprise first, second and third signal processing circuits; said signal processing circuits each comprising a pulse stretcher, a preamplifier, a base drive circuit, and a main drive circuit coupled in series, with the inputs of said first and second pulse stretcher circuits being coupled to respective outputs of said pulse steering circuit and the outputs of said first and second main drive circuits being coupled in parallel; a transformer having one side of the primary winding coupled to said main drive circuits outputs; said third pulse stretcher circuit having the input coupled to the output of said first pulse stretcher and the output of said third main drive circuit being coupled to the other side of said output transformer primary winding; a center tap of said winding being disposed for providing battery power to said circuits through said primary channel winding; the secondary of said output transformer being diode coupled across said traveling wave tube to provide output pulses from respective channels thereacross.

3. A high voltage pulser as set forth in claim 2 wherein said clamping circuit comprises a capacitor bank and diode coupled in series across said traveling wave tube, a series resistance in parallel with said capacitor bank for providing a voltage divider network, a clamp circuit transformer having the secondary thereof coupled across said capacitor bank and resistance, a power supply coupled to the primary of said clamp circuit transformer for charging said capacitor bank, an amplifier having an input coupled to the voltage divider network of said capacitor bank and having first and second outputs, said first output being coupled to said clamp power supply; a clamp dumping circuit; and a clamp dumping transformer having the primary winding thereof coupled to said clamp dumping circuit and the secondary winding thereof diode coupled across said capacitor bank; the second output of said amplifier being coupled as an input to said clamp dumping circuit.

4. A high voltage pulser as set forth in claim 3 wherein the first output of each of said first pulse stretchers in said respective channels is further coupled through a first resistance to said pulse steering circuit for gating said steering circuit and is coupled through a second resistance to said clamp dump circuit for gating said dumping circuit, and wherein the output of each of said second preamplifier circuits is further coupled to the input of said first base driving circuit.

5. A high voltage pulser as set forth in claim 4 wherein said pulse steering circuit comprises first and second transistors having the emitters thereof coupled to ground, the collector of said first transistor being coupled as the pulse stretcher input of said first channel and the collector of said second transistor being coupled as the pulse stretcher input of said second channel, first and second resistors coupled between the collectors of said first and second transistors respectively for coupling input trigger signals therethrough to said transistors, and a bistable multivibrator having first and second outputs coupled to the respective bases of said first and second transistors and an input coupled to receive said outputs of said first pulse stretcher from said channel A and channel B.

6. A high voltage pulser as set forth in claim 5 wherein said base drive circuits and said main drive circuits each comprise a transistor having the collector thereover coupled as the output and the base coupled as the input; a resistor coupled between the emitter and a circuit common; and a zener diode coupled between the base and circuit common for establishing the operating voltage of the circuit.

* * * * *